United States Patent
Binder et al.

(10) Patent No.: US 12,140,647 B2
(45) Date of Patent: Nov. 12, 2024

(54) POSITION SENSOR SYSTEM, OPTICAL LENS SYSTEM AND DISPLAY

(71) Applicant: Infineon Technologies AG, Neubiberg (DE)

(72) Inventors: Gernot Binder, Klagenfurt (AT); Dirk Hammerschmidt, Finkenstein (AT); Christoph Oswald, Munich (DE); Joo Il Park, Sungnam (KR); Armin Satz, Villach (AT)

(73) Assignee: Infineon Technologies AG, Neubiberg (DE)

( * ) Notice: Subject to any disclaimer, the term of this patent is extended or adjusted under 35 U.S.C. 154(b) by 124 days.

(21) Appl. No.: 17/937,587

(22) Filed: Oct. 3, 2022

(65) Prior Publication Data

US 2023/0105657 A1 Apr. 6, 2023

(30) Foreign Application Priority Data

Oct. 6, 2021 (DE) .......................... 102021125964.9

(51) Int. Cl.
*G01R 33/09* (2006.01)
*G01R 33/00* (2006.01)

(52) U.S. Cl.
CPC ....... *G01R 33/091* (2013.01); *G01R 33/0005* (2013.01); *G01R 33/093* (2013.01)

(58) Field of Classification Search
None
See application file for complete search history.

(56) References Cited

U.S. PATENT DOCUMENTS

| | | | | |
|---|---|---|---|---|
| 4,612,502 A | * | 9/1986 | Spies | G01D 5/20 324/207.22 |
| 6,181,036 B1 | * | 1/2001 | Kazama | G01D 5/145 310/67 R |
| 6,501,678 B1 | | 12/2002 | Lenssen et al. | |
| 2003/0048164 A1 | * | 3/2003 | Sentoku | G01D 5/2451 335/306 |
| 2004/0004471 A1 | | 1/2004 | Haas et al. | |
| 2005/0219962 A1 | * | 10/2005 | Ollila | G01D 5/2451 369/13.11 |
| 2010/0276389 A1 | * | 11/2010 | Mather | B82Y 25/00 216/22 |
| 2010/0301845 A1 | | 12/2010 | Acker | |
| 2014/0021943 A1 | | 1/2014 | Watanabe et al. | |
| 2015/0070564 A1 | | 3/2015 | Okawa | |
| 2017/0196102 A1 | * | 7/2017 | Shin | G06F 1/1605 |
| 2017/0219913 A1 | | 8/2017 | Ito et al. | |

(Continued)

FOREIGN PATENT DOCUMENTS

| | | |
|---|---|---|
| DE | 102011079019 A1 | 2/2012 |
| DE | 102018118477 A1 | 2/2020 |

(Continued)

*Primary Examiner* — Jas A Sanghera
(74) *Attorney, Agent, or Firm* — Harrity & Harrity, LLP

(57) ABSTRACT

A position sensor system comprises a magnetic strip extending in a readout direction and comprising magnetic poles alternating at a constant pitch along the readout direction. At least a first differential magnetoresistive sensor comprises magnetoresistive sensing elements spaced at the pitch. The magnetic poles of the magnetic strip and the first differential magnetoresistive sensor are movable with respect to each other in the readout direction.

17 Claims, 7 Drawing Sheets

(56) References Cited

U.S. PATENT DOCUMENTS

2019/0120914 A1* 4/2019 Hammerschmidt ........................ G01R 33/0023
2021/0116971 A1 4/2021 Feng et al.

FOREIGN PATENT DOCUMENTS

JP 2014062751 A 4/2014
JP 5761181 B2 8/2015

* cited by examiner

TMR5 of second bridge have 90° phase shifted reference magnetization

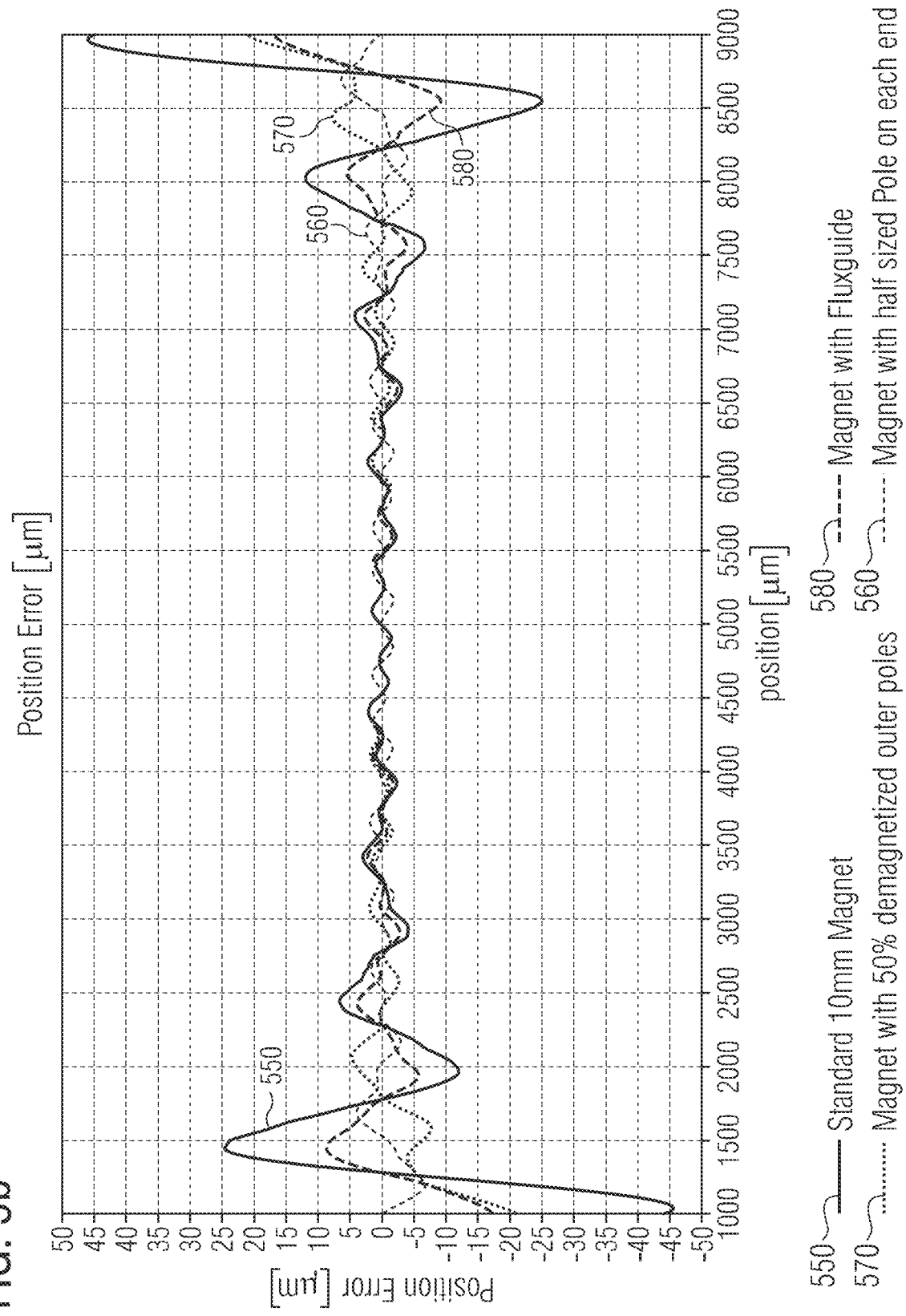

POSITION SENSOR SYSTEM, OPTICAL LENS SYSTEM AND DISPLAY

CROSS REFERENCE TO RELATED APPLICATION

This application claims priority to German Patent Application No. 102021125964.9 filed on Oct. 6, 2021, the content of which is incorporated by reference herein in its entirety.

TECHNICAL FIELD

Examples relate to position sensor systems allowing to determine relative position changes between a magnetic strip and a sensor.

BACKGROUND

High resolution linear position and motion detection has numerous applications. For example, the accurate position of the lenses needs to be detected in an optical zoom system, e.g. within a smartphone camera, where the overall construction space is very limited.

To date linear positioning systems suffer from large structures and high noise levels, making them eventually inappropriate for measurements with high accuracies.

There is a demand to enhance position sensor systems.

SUMMARY

Implementations relate to position sensor systems comprising a magnetic strip extending in a readout direction and comprising magnetic poles alternating at a constant pitch along the readout direction. The implementations further comprise at least a first differential magnetoresistive sensor comprising magnetoresistive (xMR) sensing elements spaced at the pitch, wherein the magnetic poles of the magnetic strip and the first differential magnetoresistive sensor are movable with respect to each other in the readout direction. Using magnetoresistive sensing elements intrinsically having a high sensitivity may allow to shrink the size of the magnetic poles, while receiving a readout signal having sufficient signal-to-noise ratio. Placing the magnetoresistive sensing elements such as to result with a differential magnetoresistive sensor may further increase resilience to noise, allowing to further shrink the size of the magnetic poles. The implementations of position sensor systems may, therefore, use magnetic strips with small pictures, resulting in a higher accuracy of the position sensing as compared to conventional approaches using, for example, Hall elements.

Further implementations relate to an optical assembly comprising a lens being movable with respect to the optical element along a readout direction and an implementation of a position sensor system. The magnetic strip is fixed relative to one of the optical element or the lens and the first differential magnetoresistive sensor being fixed relative to the other one of the optical element or the lens. The use of the differential magnetoresistive sensor to determine the relative position between the optical element in the lens enables to determine relative position at high accuracy, in turn allowing two, for example, accurately steer a zoom-system or similar optical systems.

Further implementations relate to a rollable display, comprising a display being extendable in a rollout direction and with respect to a fixed portion of a display framing and an implementation of a position sensor system. The magnetic strip is fixed relative to one of the display or the display framing and the first differential magnetoresistive sensor is fixed relative to the other one of the of the display or the display framing. The use of the differential magnetoresistive sensors to determine the relative position between a display and its display framing may allow to determine the position of the display with an accuracy higher than the size of a pixel of the display. This, in turn, may allow to accurately display desirable content on the display, irrespective of its present position and the fraction of the display that is presently rolled out.

BRIEF DESCRIPTION OF THE DRAWINGS

Some examples of apparatuses and/or methods will be described in the following by way of example only, and with reference to the accompanying figures, illustrating

FIG. 5b illustrates accuracies achievable with the magnetic strips;

DETAILED DESCRIPTION

Figure 1:
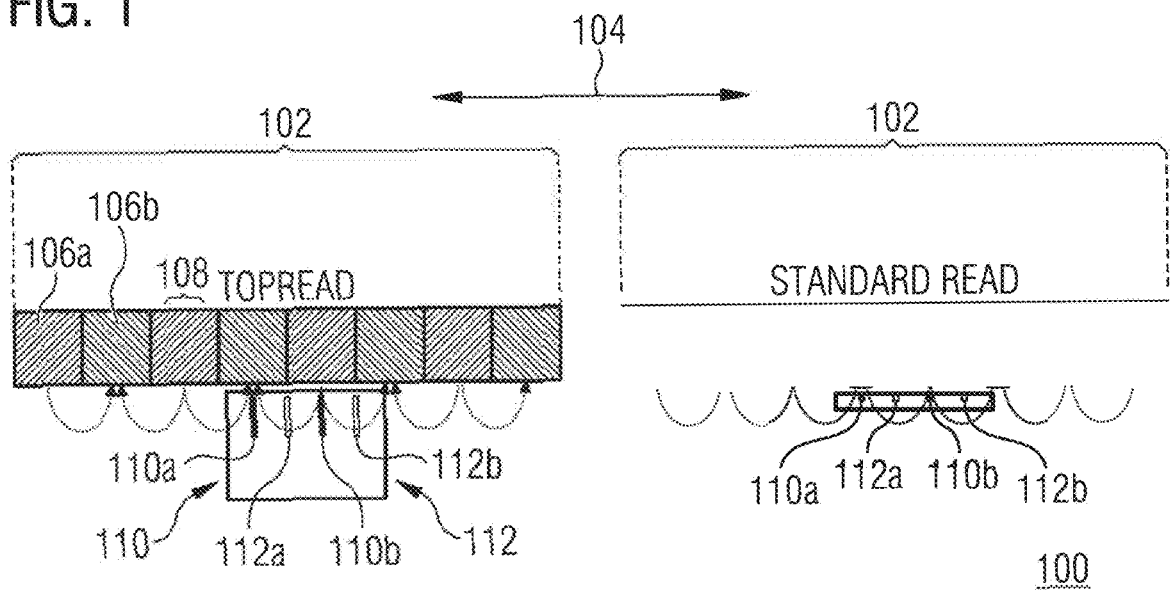
FIG. 1 illustrates an implementation of a position sensor system.

Some implementations are now described in more detail with reference to the enclosed figures. However, other possible implementations are not limited to the features of these implementations described in detail. Other implementations may include modifications of the features as well as equivalents and alternatives to the features. Furthermore, the terminology used herein to describe certain implementations should not be restrictive of further possible implementations.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, e.g. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an implementation of a position sensor system 100. In the left illustration, a top read layout is illustrated, while the right illustration of FIG. 1 illustrates a standard read configuration. Apart from that, the consideration of the individual elements of the position sensor system may be the same. A magnetic strip 102 extends in a readout direction 104 and comprises magnetic poles 106a and 106b alternating at a constant pitch 108 along the readout direction 104. The pitch (magnetic pitch) is the extension of a single magnetic pole (north or south) along the readout direction 104. Within the magnetic strip 102, multiple pairs of magnetic northpoles of one pitch length and magnetic southpoles of one pitch length are consecutively arranged along the readout direction.

The position sensor system 100 further comprises at least a first differential magnetoresistive sensor 110 comprising magnetoresistive sensing elements 110a and 110b spaced at the pitch 108. Magnetoresistive Elements (XMR Elements) may, for example, use the Giant Magnetoresistive (GMR) Effect, the Anisotropic Magnetoresistive Effect (AMR), the Colossal magnetoresistive Effect (CMR) or the Tunnel Magnetoresistive Effect (TMR) to sense a magnetic field strength. The magnetic poles of the magnetic strip 102 and the first differential magnetoresistive sensor 110 are movable with respect to each other in the readout direction 104.

The implementation illustrated in FIG. 1 further uses a second differential magnetoresistive sensor 112 comprising magnetoresistive sensing elements 112a and 112b spaced at the pitch. The first differential magnetoresistive sensor 110 and the second differential magnetoresistive sensor 112 are illustrated on the same chip, substrate, or printed circuit board. However, they shall be understood to be different magnetoresistive sensors in the sense that each of the first differential magnetoresistive sensor 110 and the second differential magnetoresistive sensor 112 provides a readout signal independently usable to evaluate the magnetic field strength. To enable differential readout behavior, the sensing elements 110a, 110b, 112a, 112b of each of the magnetoresistive sensors 110 and 112 are displaced by the pitch 108 of the magnetic strip 102 to increase the received signal-to-noise ratio and for increasing resilience to additive noise due to the differential readout. Magnetoresistive sensing elements exhibit an intrinsically high sensitivity, allowing to shrink the size of the magnetic poles to become smaller than 1 mm, 0.5 mm, or even smaller than 0.3 mm, while still resulting with a readout signal having sufficient signal-to-noise ratio.

Conventional systems based on Hall technology need to remain at higher scale (resulting in a magnetic pole pitch of significantly greater than 1 mm). The accuracy of such systems is limited by the low sensitivity and the high noise level of Hall technology. The magnet sizes of such conventional systems (pole pitch) cannot be reduced to the sizes of the proposed implementations since the resulting magnetic field would be too low to be detected by the Hall sensor. A larger pole pitch, in turn, results with a higher position error since the 360° angle range over one period (one north and one south pole of the strip magnet) is directly transformed to a linear position error.

Figure 6:
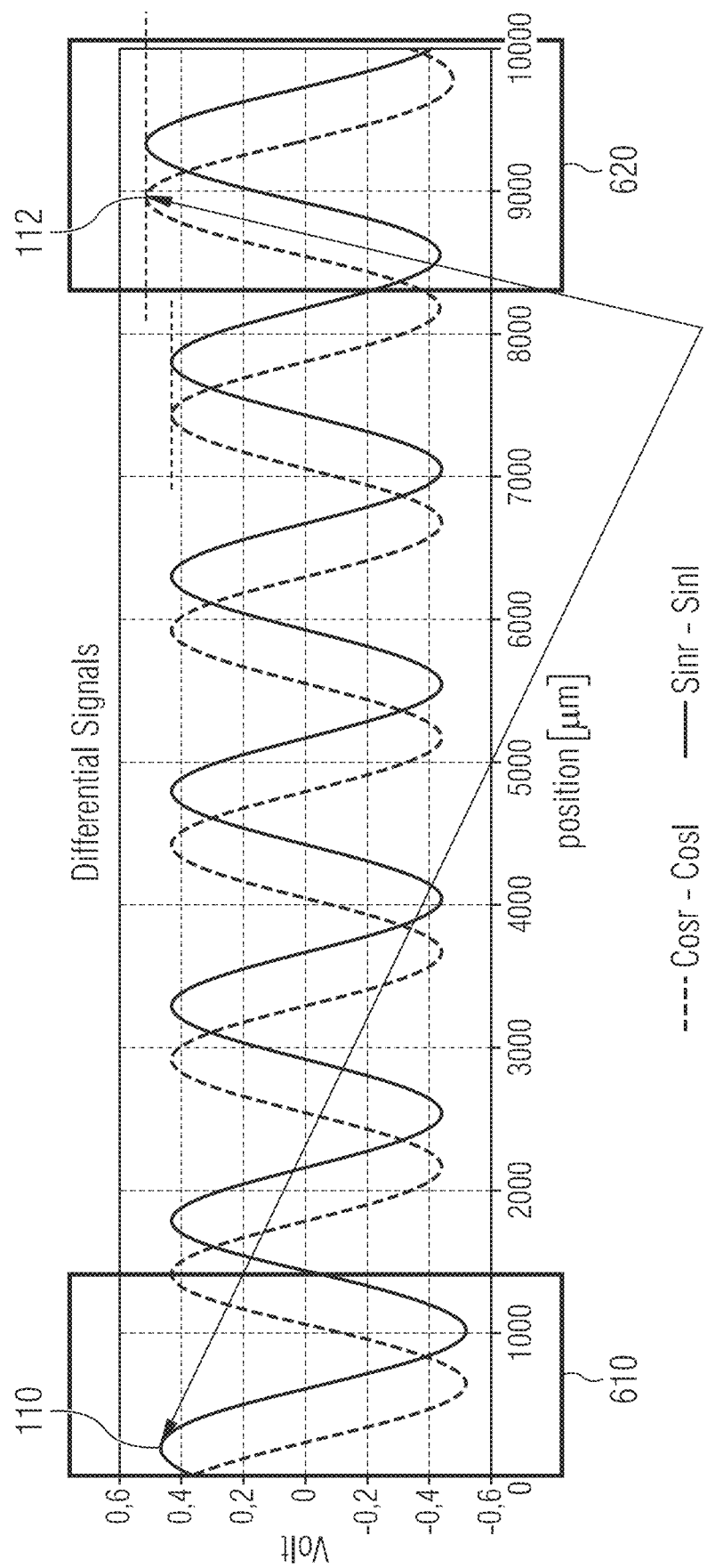
FIG. 6 illustrates an illustration of the readout signals generated from an implementation of the differential magnetoresistive sensors of a position sensor system.

While the implementation illustrated in FIG. 1 uses two separate magnetoresistive sensors, further implementations may likewise use only one magnetoresistive sensor 110 for measuring the relative position between the magnetoresistive sensor 110 and a segment of the magnetic strip 102 consisting of a pair of a north pole and a neighboring south pole. FIG. 6 illustrates readout signals received from the magnetoresistive sensors 110 and 112 while the magnetoresistive sensors 110 and 112 are moved relatively to the magnetic strip 102. For every pair of a north and south pole (forming a dipole in a simplified view), the first magnetoresistive sensor 110 generates a full swing of a sine waveform V sin, while the second magnetoresistive sensor 112 generates a full swing of a cosine waveform V cos. The position of the sensors relative to a pair of north and south poles may, for example, be determined using a phase angle Alpha evaluating the inverse of the tangents function (atan), based on the ratio of the signal of the first magnetoresistive sensor 110 and the second magnetoresistive sensor 112, Alpha=atan(V cos, V sin). The absolute position may, for example, be determined by mapping Alpha to the linear distance given by twice the pitch, additionally counting the number full swings experienced starting from either one of the end positions or ends of the magnetic strip 102.

Figure 2:
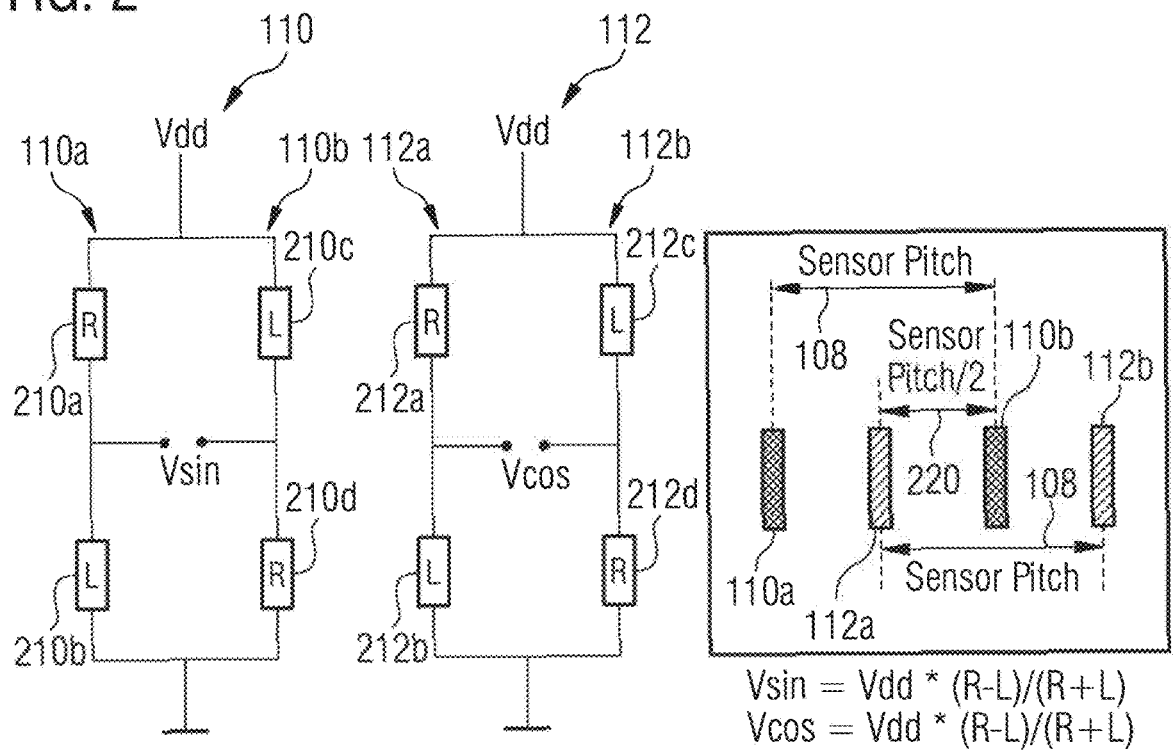
FIG. 2 illustrates an implementation of a differential magnetoresistive sensor layout for a position sensor system having two sensors at different positions.

FIG. 2 illustrates an implementation of a differential magnetoresistive sensor layout for a position sensor system having two sensors at different positions. The layout is the one already illustrated in FIG. 1. FIG. 2 further illustrates that every magnetoresistive sensor comprises four magnetoresistive sensing elements in a full bridge configuration. In the first magnetoresistive sensor 110, a first branch 110a, consisting of two magnetoresistive sensing elements 210a and 210b, is displaced from a second branch 110b, consisting of two magnetoresistive sensing elements 210c and 210d, by the pitch 108 to result with the desired differential readout. Similarly, in the second magnetoresistive sensor 112, a first branch 112a, consisting of magnetoresistive elements 212a and 212b, is displaced from a second branch 112b, consisting of magnetoresistive sensing elements 212c and 212d, by the pitch 108.

The first magnetoresistive sensor 110 and the second magnetoresistive sensor 112 are displaced by one half of the pitch 108 in the readout direction, to achieve that the first magnetoresistive sensor 110 provides as sine signal while the second magnetoresistive sensor 112 provides a cosine signal (or at least two signals phase shifted by 90 degrees), as illustrated in FIG. 6. The displacement of the sensors may, for example, be evaluated using the centers of each magnetoresistive sensor as a reference. The center of a magnetoresistive sensor is given by the center between the outermost magnetoresistive sensing elements of a sensor in the readout direction 104.

In other words, the implementation illustrated in FIG. 2 is based on two interleaved Wheatstone bridges of magnetoresistive sensing elements. In the illustrated example, the magnetoresistive sensing elements of both sensors are assumed to be TMR sensing elements which are sensitive to the in-plane field component Bx of the chip and have the same nominal resistance. The Left and Right TMRs of one bridge are spaced by the distance "sensor pitch", corresponding to the magnet pitch. The second Wheatstone bridge is arranged at a distance "sensor pitch/2" to the first bridge. For this sensor layout the magnetic pole pitch should exactly match the sensor pitch.

Figure 3:
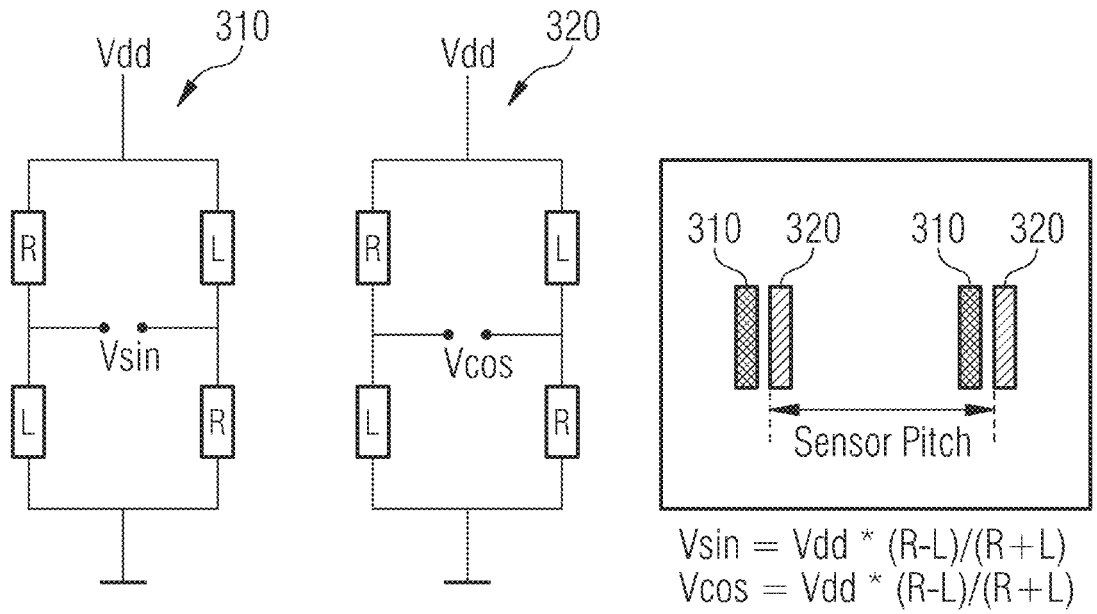
FIG. 3 illustrates an implementation of a differential magnetoresistive sensor layout for a position sensor system having two sensors at identical positions.

FIG. 3 illustrates an implementation of a differential magnetoresistive sensor layout for a position sensor system having two differential magnetoresistive sensors 310, 320 at identical positions. Like the layout of FIG. 2, the magnetoresistive sensing elements of each magnetoresistive sensor are connected using a bridge circuit. However, to enable to position the first differential magnetoresistive sensor 310 at essentially the same position than the second differential magnetoresistive sensor 320, the magnetoresistive sensing elements of the first differential magnetoresistive sensor 310 are sensitive to magnetic fields in a first direction, and the magnetoresistive sensing elements of the second differential magnetoresistive sensor 320 are sensitive to magnetic fields in a second direction which is perpendicular to the first direction.

For example, the first differential magnetoresistive sensor 310 may be sensitive to the x-component of the in-plane magnetic field, while second differential magnetoresistive sensor 320 is sensitive to the y-component of the in-plane magnetic field generated by the magnetic strip. This, in turn, results in the desirable sine and cosine signals of the respective magnetoresistive sensors.

According to some examples, the orthogonal sensitivity of the two differential magnetoresistive sensors 310 and 320 is achieved by manufacturing the pinned layers of the magnetoresistive sensing elements of the first differential magnetoresistive sensor perpendicular to pinned layers the magnetoresistive sensing elements of the second differential magnetoresistive elements.

Figure 4:
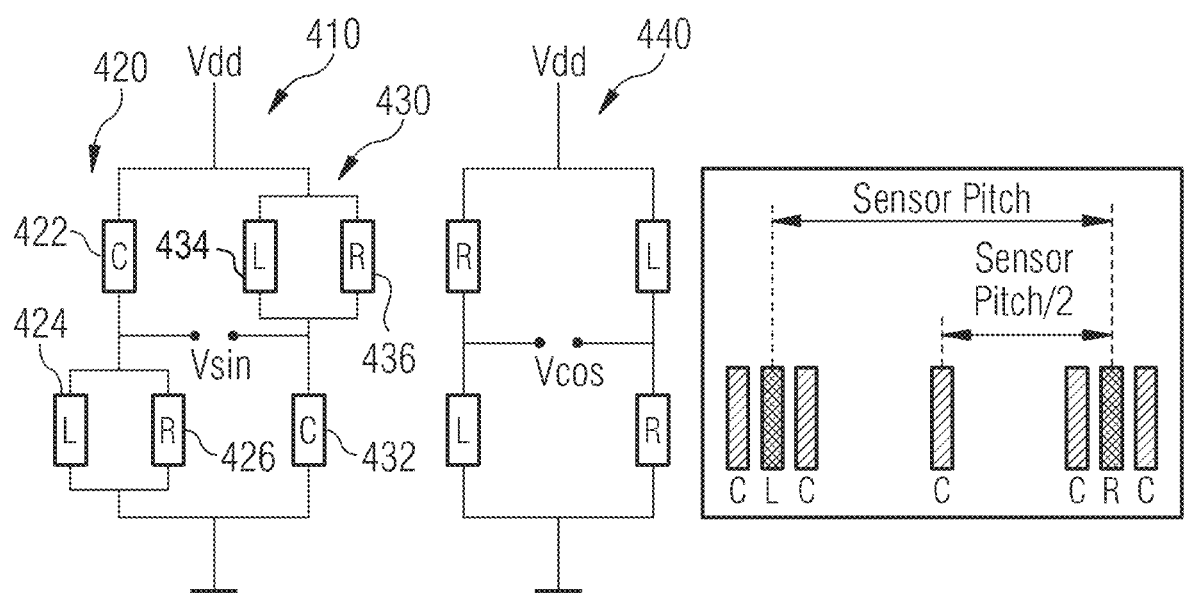
FIG. 4 illustrates an implementation of a differential magnetoresistive sensor layout for a position sensor system.

FIG. 4 illustrates a further implementation of a differential magnetoresistive sensor layout for a position sensor system.

While the second magnetoresistive sensor 440 corresponds to the second magnetoresistive sensor 112 illustrated in FIG. 2, the first magnetoresistive sensor 410 deviates from the previously illustrated layouts in that additional center magnetoresistive sensing elements 422 and 436 are present in each of the branches 420 and 430 of the bridge the circuit. The first center magnetoresistive sensing element 422 is part of the first branch 420, further comprising a left magnetoresistive sensing element 424 as well as a right magnetoresistive sensing element 426. The left magnetoresistive sensing element 424 is spaced from the right magnetoresistive sensing element 426 by a pitch length 108, while the first center magnetoresistive sensing element 422 is positioned in the center between those. Similarly, the right branch 430 comprises left magnetoresistive sensing element 434 and right magnetoresistive sensing element 436, displaced by a sensor pitch 108, as well as a second center magnetoresistive sensing element 432 centered between those.

In this configuration the first magnetoresistive sensor 410 provides a signal which is proportional to C−(L+R)/2. The nominal resistances C of the center 422, 432 are only half of the nominal resistances L and R of left and right magnetoresistive sensing elements 422, 424, 432, 434 The distance of the center magnetoresistive sensing elements to the outer left and right magnetoresistive sensing elements is only half the size of the pitch 108 (also corresponding to the "sensor pitch" of the second bridge 440). The signal of the first magnetoresistive sensor 410 has only half the amplitude of the second magnetoresistive sensor 440. However, an amplitude mismatch can easily be corrected by the factor of two, e.g. within an external microcontroller. The layout of the implementation of FIG. 4 provides for an advantage if the pitch within the magnetoresistive sensors does not match the pitch 108 of the magnet strip 102 to the required extent. Other than in the preceding configurations, such a systematic mismatch does not introduce an orthogonality error in the implementation of FIG. 4, but only an amplitude mismatch between the sensors, which can be compensated by calibration. Therefore, also in case of a non-ideal sensor pitch vs. magnet pole pitch mismatch a highly accurate position determination is achievable.

The following paragraphs shortly indicate, how a position may be determined from the sensor readings of the layout of FIG. 4, assuming a pitch of 0.5 mm. The differential output signals of the bridges of the magnetoresistive sensors 410 and 440 are proportional to the magnetic field at the sensing elements:

$V \cos \sim BxL-BxR$, and $V \sin \sim BxC-(BxL+BxR)/2$, with B indicating the Strength of the Magnetic field in the sensitive direction.

Due to the differential sensing principle, homogeneous stray-field components cancel out and the measurement becomes independent from external disturbance fields.

From those two differential signals an angle Alpha is calculated using the trigonometric arc tangent function (atan2).

$Alpha=atan\ 2(V \cos, V \sin)$

If one uses a multipole strip magnet with pole length (pitch) of 500 µm, one North and one South Pole form one dipole with 1 mm length. The length of 1 mm translates to an angle information from 0 to 360°. An error in angle determination therefore directly translates into a linear position error by dividing the angle error through the dipole length.

The implementations according to FIGS. 2 and 4 can optionally also be mounted in the TOPREAD configuration illustrated in the left layout of FIG. 1. In the TROPREAD configuration, sensor chip is tilted by 90°. In this configuration, a very small airgap between magnet surface and sensing elements can be realized, if the sensing elements are placed close to the upper edge of the chip.

Figure 5A:
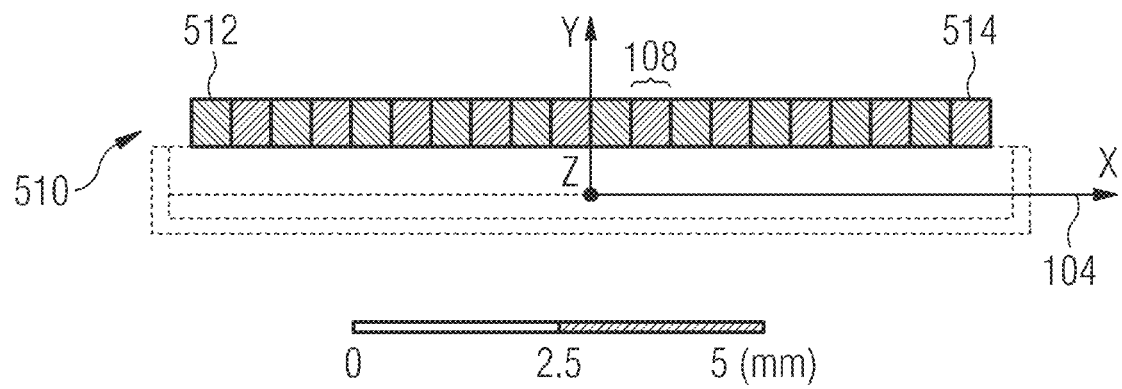
FIG. 5a illustrates two implementations of magnetic strips for a position sensor system.
Figure 5A:
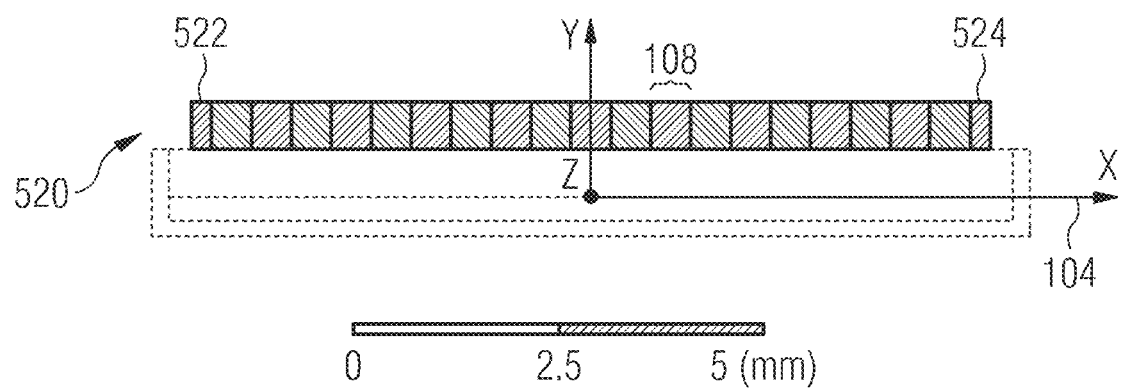
Figure 5A:
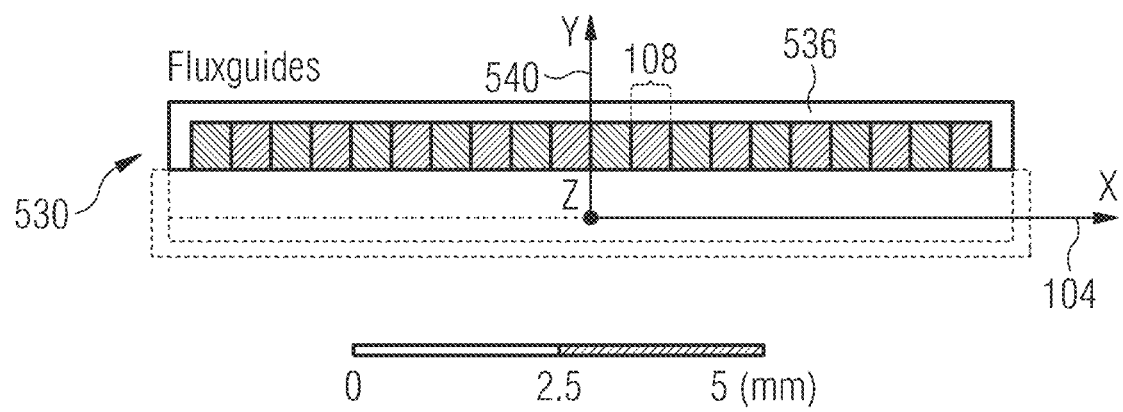

While the previous paragraphs illustrated several different configurations of differential magnetic sensors that can be used within an implementation of a position sensor system, FIG. 5a illustrates three magnetic strip configurations usable within the position sensor system. In FIG. 5a, the readout direction is chosen to be the x-axis of the illustration, while a direction perpendicular to the readout direction 104 is given by the y-axis.

The three configurations 510, 520 and 530 illustrated share the property that magnetic poles alternate at a constant pitch along the readout direction 104 within the magnetic strips. However, the magnetic strips have different configurations at the ends in the readout direction. The first configuration 510 has magnetic poles 512 and 514 of full width (e.g. at the width of one pitch) at both ends of the magnetic strip.

The second configuration 520 has magnetic poles 522 and 524 of only half a width of the pitch 108 at both hands of the magnetic strip.

In the third configuration 530, the magnetic poles are surrounded by a flux guide 536. The flux guide 536 covers both ends of the magnetic strip and one side of the strip in a direction 540 perpendicular to the readout direction 104.

The first configuration 510 may result with a decreased positioning accuracy towards the end of the magnetic strip since the periodicity the measurement principle relies on is disturbed towards the end of the strip. In particular, the influence of the magnetic poles 512 and 514 becomes more dominant when reaching the end of the strip.

FIG. 5b illustrates the measurement accuracies achievable with the magnetic strip configurations of FIG. 5a. The x-axis indicates the linear displacement between the magnetoresistive sensors and the magnetic strip for an example length of 10 mm and a pitch of 0.5 mm. The Y-axis illustrates the positioning error in units of micrometers. While the absolute quantities of the errors correspond to the set up measured, the conclusions regarding the strip configurations are likewise true for other configurations using magnetic strips following the different designs illustrated in FIG. 5a.

Graph 550 corresponds to the measurement error for the magnetic strip configuration 510. As previously indicated, the measurement error becomes significant towards both ends of the magnetic strip, eventually exceeding +/1 50 micron.

The strip configuration 520 illustrated in FIG. 5a leads to a strong decrease in the positioning error since the magnetic poles 522, 524 at both ends of the magnetic strip have only half the width of the magnetic poles within the strip. Therefore, the dominance of the magnetic poles 522 and 524 on both ends of the magnetic strip is strongly decreased, since the magnetic field generated by those poles is weaker than a comparative magnetic field generated by a magnetic pole of full width. Graph 560 illustrates that the measurement accuracy is strongly increased towards the end of the magnetic strip when a magnetic strip configuration 520 is used. The graph illustrates that very low errors below 10 or even 5 microns can be achieved over almost the entire length of the magnetic strip.

In the configuration 530, the flux guide 536 closes the magnetic field at the ends of the magnetic strip and so also strongly decreases the dominance of the outermost poles of the magnetic strip. Graph 580 illustrates that the measurement accuracy is strongly increased as compared to the standard configuration 510 when a flux guide is used.

Graph 570 illustrates the measurement accuracy using a further possible configuration of the magnetic strip. Graph 570 corresponds to a magnetic strip where the outermost poles are demagnetized by 50%, while having a width of a full pitch. The configuration corresponding to graph 570 is not illustrated in FIG. 5a since a graphic illustration of the principle appears to be hard to accomplish.

It may be noted that further implementations may likewise be based on an arbitrary combination of the previously described configurations. For instance, the position error of the magnet with the "half poles" (second configuration 520) could be further reduced by partially demagnetizing the outermost poles. The position error of the magnet with the "half poles" could similarly be further reduced by partially demagnetizing the outermost poles.

It has been previously indicated that determining the absolute position may require to count the occurrences of full swings of the sensor readings further to the evaluation of the sensor signals while the sensors move along the magnetic strips.

FIG. 6 illustrates readout signals 110 and 112 generated using the differential magnetoresistive sensors of a position sensor system. As previously described, a first differential magnetoresistive sensor may provide for a sine signal 110 and a second differential magnetoresistive sensor may provide for a cosine signal 112 when the sensors are relatively moved to the magnetic strip. As illustrated in FIG. 6, the amplitude of the sensor signals 110 and 112 may vary significantly towards the ends of the extension of the magnetic strip and to a minor extent also along the entire length of the magnetic strip. The variation becomes more significant in areas 610 and 620 towards the ends of the magnetic strip. This is due to the effects described in connection with FIG. 5a and FIG. 5b.

However, some implementations exploit the intrinsically present effect to determine the absolute position without requiring to mechanically move the sensor or the magnetic strip to an and position initially and to start counting the number of sign or cosine waves from then own. To the contrary, implementations of position sensor systems may positively evaluate the amplitude increase or decrease towards the end of the magnetic strip work to conclude on a reference position. Similarly, amplitude variations of the sensor readings along the entire length of the magnetic strip are used to determine, which pair of magnetic poles as presently causing the magnetic field measured by the sensors by some implementations. Therefore, some implementations may be capable of determining the absolute position along the length of the magnetic strip without requiring counting the number of full sign or cosine swings from a start position given by mechanical stop at either end of the magnetic strip.

Figure 7:
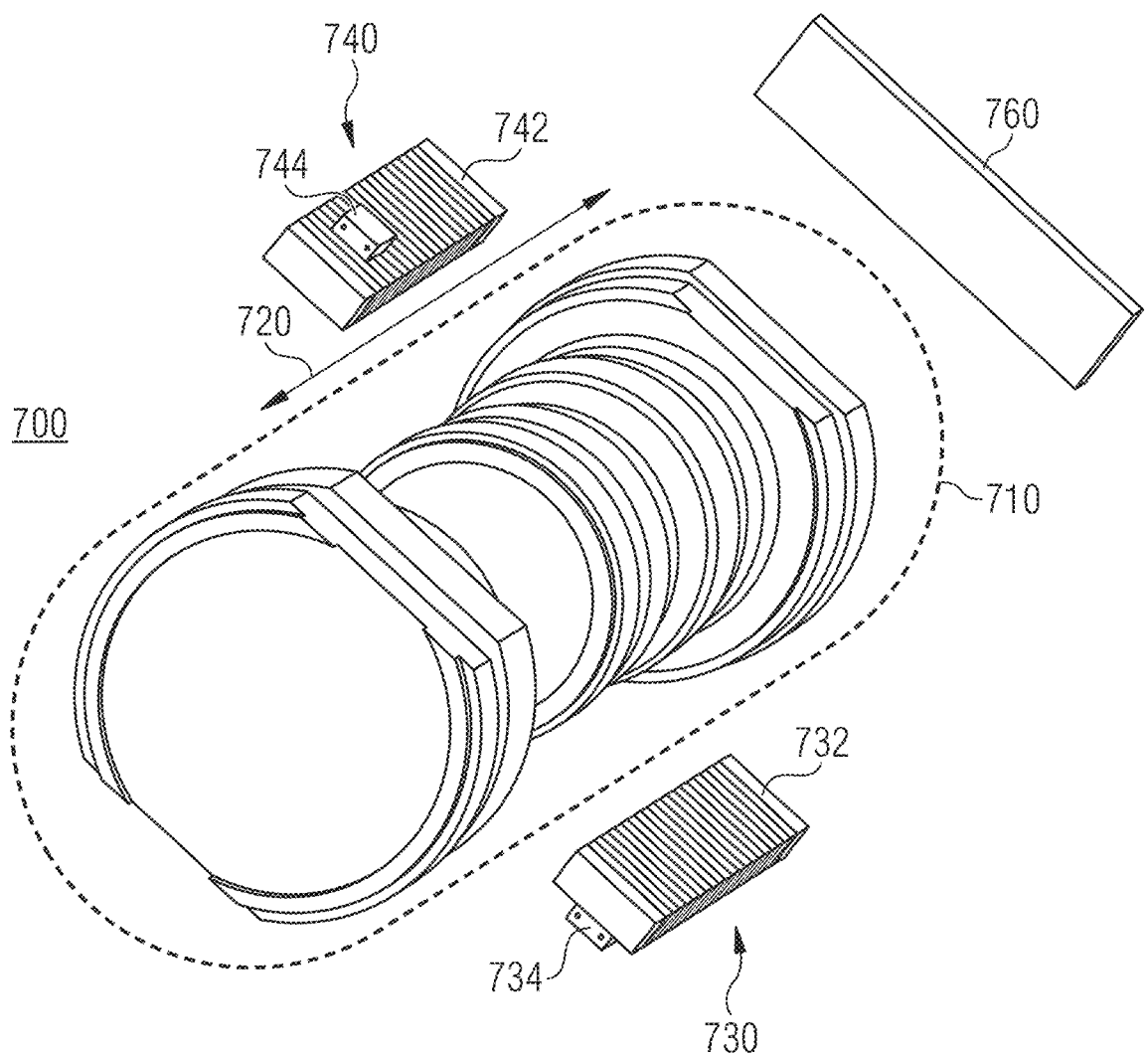
FIG. 7 illustrates an implementation of an optical system.

Having the capability to precisely determine linear movement has multiple new applications, in particular if it becomes feasible to determine the position with an accuracy of several microns or of several tenth of microns. Such a high measurement accuracy may be an enabler for entering new applications, as for example the one illustrated in FIG. 7. FIG. 7 illustrates an implementation of an optical system 700.

The optical system 700 comprises an optical element 760 which is a CCD camera device in this example. The optical system 700 further comprises a lens system 710 having at least a single lens. The lens system 710 is movable relative to the CCD 760 in the readout direction 720 to implement a zoom for the optical system 700. The optical system illustrated in FIG. 7 may, for example, be employed within a mobile device camera of a mobile phone to provide optical zoom capabilities even though the available space is extremely limited.

In order to be able to control the illustrated zoom accurately, implementations of position sensor systems 730 and 740 are used, each comprising a magnetic strip 732, 742 and an associated magnetoresistive sensor 734, 744.

Either the magnetic strips 732, 742 or the magnetoresistive sensors 734, 744 are fixed relative to lens system 710. The respective other component of the position sensor systems 730, 740 are fixed relative to the optical element 760 to be able to precisely measure relative movement between the optical element 760 and the lens system 710.

Using such a configuration, the optical zoom within a mobile device camera may be accurately controlled or measured at only minimal space requirements.

Figure 8:
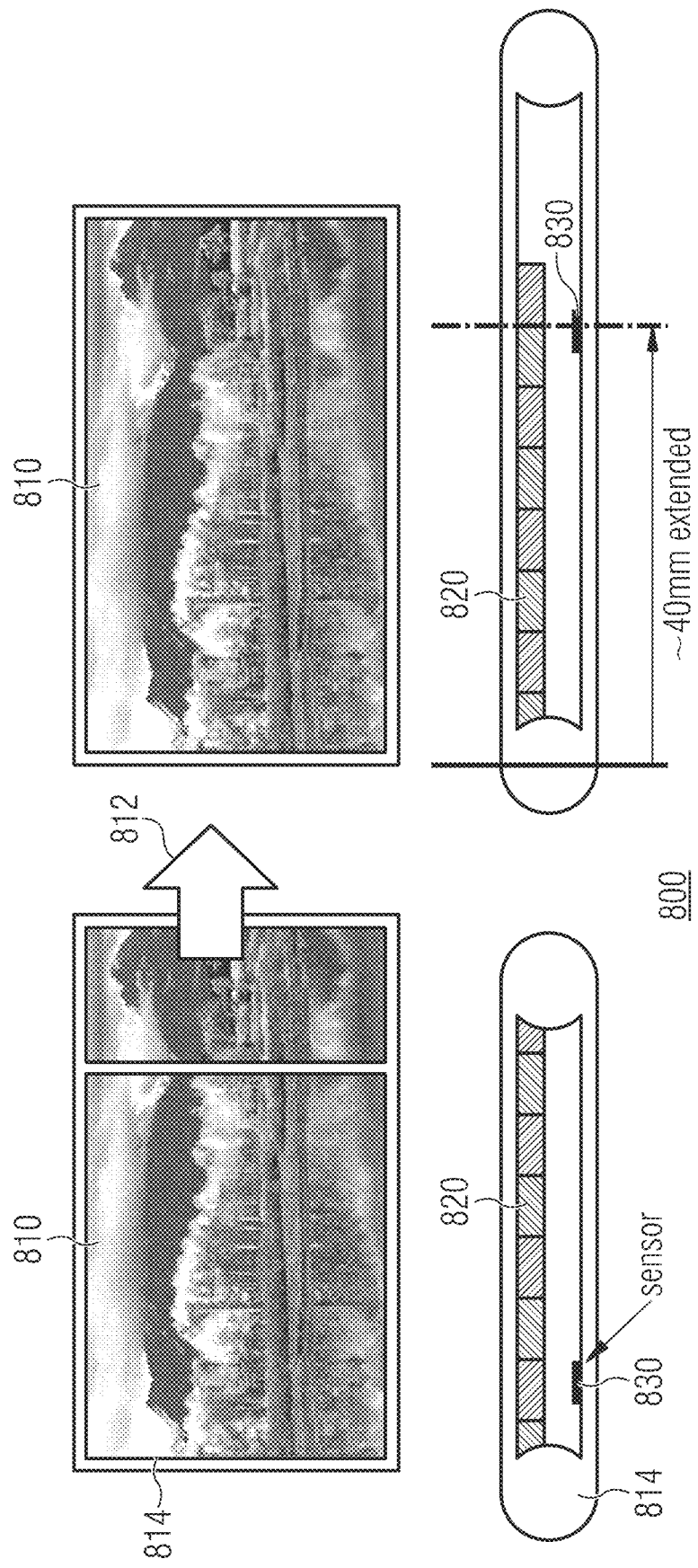
FIG. 8 illustrates an implementation of a rollable display.

FIG. 8 illustrates an implementation of a rollable display 810 using an implementation of a position sensor system to precisely determine the length the rollable display is extended in a rollout direction 812.

The rollable display 810 is extendable in a rollout direction 812 and with respect to a fixed portion of a display framing 814. Within the framing 814 or within a housing, the display 810 may be rolled in a cylindrical manner or it may also be folded or otherwise bent around a cylinder or a similar mechanic to enable the visible portion of the display to be decreased and to hide the display within a housing or within the display framing 814. The display framing 814 may, for example, be a framing present solely for the purpose of supporting the display or it may likewise be defined by other external components, such as for example the body of a mobile phone or a tablet computer device.

To determine the extent to which the rollable display has been extended in the rollout direction 812, the magnetic strip 820 is fixed relative to one of the display 810 or the display framing 814 and the first differential magnetoresistive sensor 830 is fixed relative to the other one of the of the display 810 or the display framing 814. In other words, the magnetoresistive sensor 830 is fixed to the display framing 814 and magnetic strip 820 is fixed to the rollable display 810 or the magnetoresistive sensor 830 is fixed to the rollable display 810 and the magnetic strip 820 is fixed to the display framing 814.

The use of an implementation of a position sensor system to determine the relative position between a display and its display framing may allow to determine the position of the display with an accuracy higher than the size of a pixel of the display. This, in turn, may allow to accurately display desirable content on the display, irrespective of its present position and the fraction of the display that is presently rolled out.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by programmed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. A position sensor system comprising:
   a magnetic strip extending in a readout direction and comprising magnetic poles alternating at a constant pitch along the readout direction;
   at least a first differential magnetoresistive sensor comprising magnetoresistive sensing elements spaced at the pitch, wherein the magnetic poles of the magnetic strip are movable with respect to the first differential magnetoresistive sensor in the readout direction, and
   wherein an extent to which a display associated with the position sensor system has been extended is determined based on the magnetic strip being fixed relative to one of the display or the display framing and the first differential magnetoresistive sensor is fixed relative to the other one of the of the display or display framing.

2. The position sensor system of claim 1, further comprising:
   a second differential magnetoresistive sensor comprising magnetoresistive sensing elements spaced at the pitch.

3. The position sensor system of claim 2, wherein the first differential magnetoresistive sensor and the second differential magnetoresistive sensor are displaced by half the pitch in the readout direction.

4. The position sensor system of claim 2, wherein the first differential magnetoresistive sensor and the second differential magnetoresistive sensor have a same position in the readout direction, wherein the magnetoresistive sensing elements of the first differential magnetoresistive sensor are sensitive to magnetic fields in a first direction, and
   wherein the magnetoresistive sensing elements of the second differential magnetoresistive sensor are sensitive to magnetic fields in a second direction, the second direction being perpendicular to the first direction.

5. The position sensor system of claim 4, wherein pinned layers of the magnetoresistive sensing elements of the first differential magnetoresistive sensor are perpendicular to pinned layers of the magnetoresistive sensing elements of the second differential magnetoresistive sensor.

6. The position sensor system of claim 2, wherein the first differential magnetoresistive sensor and the second differential magnetoresistive sensor have a same position in the readout direction, wherein the first differential magnetoresistive sensor further comprises centered magnetoresistive sensing elements centered between the magnetoresistive sensing elements spaced at the pitch.

7. The position sensor system of claim 1, wherein the magnetic poles at both ends of the magnetic strip have a width of one half of the pitch.

8. The position sensor system of claim 1, wherein the magnetic poles are surrounded by a flux guide, covering both ends of the magnetic strip and one side of the magnetic strip in a direction perpendicular to the readout direction.

9. The position sensor system of claim 1, wherein the pitch is within an interval starting at 0.1 mm and ending at 1 mm.

10. An optical system, comprising:
- an optical element,
- a lens being movable with respect to the optical element along a readout direction; and
- a position sensor system comprising:
    - a magnetic strip extending in a readout direction and comprising magnetic poles alternating at a constant pitch along the readout direction; and
    - at least a first differential magnetoresistive sensor comprising magnetoresistive sensing elements spaced at the pitch,
        - wherein the magnetic poles of the magnetic strip are movable with respect to the first differential magnetoresistive sensor in the readout direction, and
        - wherein an extent to which a display associated with the optical system has been extended is determined based on the magnetic strip being fixed relative to one of the optical element or the lens and the first differential magnetoresistive sensor being fixed relative to the other one of the optical element or the lens.

11. The optical system of claim 10, wherein the optical system is included in a mobile telecommunication device comprising an optical system.

12. The optical system of claim 10, wherein the position sensor system further comprises:
- a second differential magnetoresistive sensor comprising magnetoresistive sensing elements spaced at the pitch.

13. The optical system of claim 12, wherein the first differential magnetoresistive sensor and the second differential magnetoresistive sensor are displaced by half the pitch in the readout direction.

14. A rollable display, comprising:
- a display being extendable in a rollout direction and with respect to a fixed portion of a display framing; and
- a position sensor system comprising:
    - a magnetic strip extending in a readout direction and comprising magnetic poles alternating at a constant pitch along the readout direction; and
    - at least a first differential magnetoresistive sensor comprising magnetoresistive sensing elements spaced at the pitch,
        - wherein the magnetic poles of the magnetic strip are movable with respect to the first differential magnetoresistive sensor in the readout direction, and
        - wherein an extent to which the rollable display has been extended is determined based on the magnetic strip being fixed relative to one of the display or the display framing and the first differential magnetoresistive sensor is fixed relative to the other one of the of the display or the display framing.

15. The rollable display of claim 14, wherein the rollable display is included in a mobile telecommunication device.

16. The rollable display of claim 14, wherein the position sensor system further comprises:
- a second differential magnetoresistive sensor comprising magnetoresistive sensing elements spaced at the pitch.

17. The rollable display of claim 16, wherein the first differential magnetoresistive sensor and the second differential magnetoresistive sensor are displaced by half the pitch in the readout direction.

* * * * *